US012669545B2

(12) United States Patent  (10) Patent No.: US 12,669,545 B2
Simonis et al.  (45) Date of Patent: Jun. 30, 2026

(54) METHOD AND APPARATUS FOR PROVIDING AN AGING STATE FOR A DEVICE BATTERY HAVING CORRECTION OF STATE OBSERVATIONS ON THE BASIS OF SYSTEMATIC STATE AND ENVIRONMENTAL INFLUENCES

(71) Applicant: Robert Bosch GmbH, Stuttgart (DE)

(72) Inventors: Christian Simonis, Leonberg (DE);
Kaushik Sahoo, Bhubaneswar (IN);
Mario Kluender, Renningen (DE);
Raimund Kaiser, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 743 days.

(21) Appl. No.: 18/076,697

(22) Filed: Dec. 7, 2022

(65) Prior Publication Data

US 2023/0184840 A1    Jun. 15, 2023

(30) Foreign Application Priority Data

Dec. 10, 2021    (DE) ..................... 10 2021 214 161.7

(51) Int. Cl.
*G01R 31/374*    (2019.01)
*G01R 31/367*    (2019.01)
*G01R 31/371*    (2019.01)
*G01R 31/392*    (2019.01)

(52) U.S. Cl.
CPC ......... *G01R 31/374* (2019.01); *G01R 31/367* (2019.01); *G01R 31/371* (2019.01); *G01R 31/392* (2019.01)

(58) Field of Classification Search
CPC ........................... G01R 31/374; G01R 31/392
See application file for complete search history.

(56) References Cited

U.S. PATENT DOCUMENTS

| | | | |
|---|---|---|---|
| 12,136,841 B2 * | 11/2024 | Lee .................... | G01R 31/3835 |
| 2018/0037130 A1 * | 2/2018 | Ohkawa ............... | B60W 20/50 |
| 2023/0039183 A1 * | 2/2023 | Ohkawa ............... | G01R 31/392 |

FOREIGN PATENT DOCUMENTS

| | | | | |
|---|---|---|---|---|
| DE | 102017103617 A1 * | 8/2018 | ......... | H01M 10/486 |
| DE | 10 2019 217 299 A1 | 5/2021 | | |
| DE | 10 2020 206 592 A1 | 12/2021 | | |

OTHER PUBLICATIONS

DE102017103617 translated abstract (Year: 2018).*
DE102017103617 translated specification (Year: 2018).*

* cited by examiner

*Primary Examiner* — John E Breene
(74) *Attorney, Agent, or Firm* — Maginot, Moore & Beck LLP

(57) ABSTRACT

The disclosure relates to a method for providing an aging state of a device battery of a battery-operated device including detecting curves of operating variables of the device battery and providing at least one load factor at a determination time, providing a correction model that maps a correction variable depending on the at least one load factor, and ascertaining an aging state by evaluating the curves of the operating variables with the aid of an aging state model or an aging state observer or an aging state measurement and depending on the correction variable resulting from the at least one load factor of the device battery of the battery-operated device at the determination time.

13 Claims, 3 Drawing Sheets

1

METHOD AND APPARATUS FOR PROVIDING AN AGING STATE FOR A DEVICE BATTERY HAVING CORRECTION OF STATE OBSERVATIONS ON THE BASIS OF SYSTEMATIC STATE AND ENVIRONMENTAL INFLUENCES

This application claims priority under 35 U.S.C. § 119 to patent application no. DE 10 2021 214 161.7, filed on Dec. 10, 2021 in Germany, the disclosure of which is incorporated herein by reference in its entirety.

The disclosure relates to grid-independently operated electrical devices having device batteries, in particular electrically drivable motor vehicles, in particular electric vehicles or hybrid vehicles, and also relates to measures for determining a present or predicted aging state (SOH: state of health) of the device battery.

BACKGROUND

The supply of energy to grid-independently operated electrical devices and machines, such as electrically drivable motor vehicles, takes place by means of device batteries or vehicle batteries. These supply electrical energy for operating the devices.

Device batteries degrade over their service life and depending on their loading or usage. This so-called aging leads to a continuously decreasing maximum power capacity or storage capacity. The aging state corresponds to a measure for specifying the aging of device batteries. A new device battery conventionally has an aging state that relates to its available capacity of 100%, which noticeably decreases over the course of its service life. A measure of the aging of the device battery (change in the aging state over time) depends on individual loading of the device battery, i.e., in the case of vehicle batteries of motor vehicles, it depends on the usage behavior of a driver, external environmental conditions, and the type of vehicle battery.

Although the present aging state of the device battery can be determined on the basis of historical operating variable curves with the aid of a physical aging state model, this model is inaccurate in certain situations. The inaccuracy of the conventional aging state model makes accurate state determination and the prediction of the aging state curve more difficult. However, the prediction of the aging state curve of the device batteries is an important technical variable, since it makes it possible to determine the remaining service life and to carry out an economic evaluation of a residual value of the device battery. Furthermore, the prediction of the aging state is valuable for planning and carrying out predictive maintenance intervals.

SUMMARY

According to the disclosure, a method for determining an aging state of a device battery in a battery-operated device, in particular an electrically drivable motor vehicle, and an apparatus and a battery-operated device according to the disclosure are provided.

Further embodiments are specified in the disclosure.

According to a first aspect, a method for providing an aging state of a device battery of a battery-operated device is provided, comprising the following steps:

detecting curves of operating variables of the device battery and providing at least one load factor of the device battery at a determination time;

providing a correction model that maps a correction variable depending on the at least one load factor;

ascertaining an aging state by evaluating the curves of the operating variables with the aid of an aging state model or an aging state observer or an aging state measurement and depending on the correction variable resulting from the at least one load factor of the device battery of the battery-operated device at the determination time.

Furthermore, the correction model can be created by evaluating operating variables and the relevant at least one load factor of a plurality of device batteries, comprising the steps of:

detecting curves of operating variables of the plurality of device batteries and at least one associated load factor at a particular determination time;

evaluating the operating variables of the plurality of device batteries within an evaluation period in order to ascertain the modeled aging state of the relevant device battery in each case at the particular determination times;

ascertaining an aging state function of a smoothed curve of the aging state within the evaluation period for all aging states of the plurality of device batteries across their calendar age, which aging states result from the particular determination time;

determining residuals of the aging states of all device batteries for each determination time as a difference of the modeled aging state and the function value of the aging state function at the calendar age associated with the modeled aging state;

for the plurality of device batteries, providing residual data which associate residuals with the at least one load factor associated with the correspondingly underlying modeled aging state;

creating the correction model based on the residual data, which model maps a correction variable dependent on or corresponding to the residuals, depending on the at least one load factor.

The aging state of a device battery is usually not measured directly. This would require a series of sensors inside the device battery, which would make production of such a device battery costly as well as complex, and would increase the space requirement. Moreover, measurement methods suitable for everyday use for the direct determination of the aging state in the device batteries are not yet commercially available.

In the case of device batteries, the aging state (SOH: state of health) is the key variable for specifying a remaining battery capacity or remaining proportional range at full battery charge. The aging state represents a measure of the aging of the device battery. In the case of a device battery or a battery module or a battery cell, the aging state may be specified as a capacity retention rate (SOH-C). The capacity retention rate SOH-C is given as the ratio of the measured present capacity to a starting capacity of the fully charged battery. Alternatively, the aging state may be given as an increase in internal resistance (SOH-R) with respect to internal resistance at the start of the service life of the device battery. The relative change in the internal resistance SOH-R increases with increasing aging of the battery.

In the case of unknown battery types of device batteries in battery-operated machines, it is possible, in certain circumstances, for no specification of the aging state of the relevant device battery to be ascertained or provided outside the battery control device. Only operating variables such as battery voltage, battery current, battery temperature and/or state of charge can be read out in these cases.

However, the operating variables are significantly influenced by at least one load factor, such as one or more battery states and/or one or more environmental conditions; in particular ambient temperature influences both the modeling of the state of charge and the total charge capacity of the device battery. As a result, the determination of the aging state, both of the SOH-C and of the SOH-R, on the basis of an evaluation of operating states of the device battery is significantly influenced.

The aging state can be provided as a capacity-related aging state (SOH-C) or as a resistance-change-related aging state (SOH-R), wherein the aging state model is designed to ascertain the capacity-related aging state by evaluating a battery current during a charging phase of the device batteries, in particular by means of a coulomb counting method, or to ascertain the resistance-change-related aging state by evaluating a voltage gradient in the case of a load jump which is greater than a predefined threshold value. Alternatively, the aging state can also be determined by an aging state observer or another aging state measurement.

Depending on the operating variables, which comprise at least one of the variables of battery current, battery voltage, battery temperature, state of charge, the particular aging state of a device battery can be determined by observing the battery behavior during certain operating situations, such as a load jump, a charging process or a discharging process. However, these methods are inherently inaccurate and not suitable for estimating a remaining service life. Even in batteries of known battery types, accuracies of 3-5% cannot be guaranteed in this way in all operating modes, since these are substantially dependent on the usage-related operating profile, such as the evaluated shift of the state of charge, an average temperature range of battery operation, and the like.

In the above method, the aging state is ascertained, preferably by means of a so-called basic model, and can be learned and calculated from one or more load variables that specify systematic environmental influences or operating mode influences, by evaluating operating variables of a plurality of device batteries.

The at least one load factor can comprise one or more battery states and/or one or more environmental conditions and in particular one or more of the following variables:

an ambient temperature for the time of determination of the relevant aging state;

a battery temperature for at least one time or an average battery temperature during the determination of the relevant aging state;

a starting state of charge and/or a final state of charge when determining the aging state during a charging process;

a specification of a non-linearity of the current curve or state of charge curve during the determination of the relevant aging state or a partial specification of the relationship of a state of charge shift to an ampere-hour throughput (dSoC/dAh) during a charging process;

one or more no-load terminal voltages, specifically in the relaxed state after a sufficiently long rest phase at one or more predetermined temperatures;

a battery temperature at a predetermined no-load terminal voltage in the relaxed state after a sufficiently long rest phase;

the aging state of the battery; and one or more electrochemical state parameters of the battery cells of the battery.

Instead of or in addition to a model, the basic model can comprise a direct or indirect measurement method. Furthermore, in the method a global correction function can be learned on the basis of swarm intelligence of all the fleet participants, so that systematic influences on an indirect measurement of an aging state, an evaluation of an aging state model or an observer for the aging state can be learned, in order to correct an aging state thus ascertained in a subsequent step.

The basic model for determining a capacity-related aging state (SOH-C) uses the curves of the operating variables in order to identify a charging or discharging phase of the battery utilization. An SOH-C estimate is preferably carried out by coulomb counting or by forming a temporal current integral during the charging process, which integral is divided by the shift of the state of charge between the beginning and the end of the relevant charging and/or discharging phase. Advantageously, calibration on the no-load voltage characteristic is in this case carried out in rest phases in order to also calculate the state of charge curve in the central unit. The maximum charge detected thereby can be related to a maximum initial charging capacity of the vehicle battery. The ratio corresponds to the capacity-related aging state SOH-C. Usually the capacity-related aging state SOHC is defined at a defined temperature, e.g., in the discharging direction under specified environmental and load conditions.

In the basic model for determining a resistance-change-related aging state (SOH-R values), a voltage change in relation to a current change during a load jump can be evaluated and related to a standard value in order to obtain the resistance-change-related aging state SOH-R.

In the above method, a correction model across multiple devices can be produced, which identifies systematic observation influences in the operating variables and, based on the model, can provide a correction variable for correcting a by means of an aging state ascertained in a suitable manner. As a result, the accuracy of the calculation of the aging state is increased, in particular by any model, and the sensitivity to changing environmental conditions, such as a temperature drop in the ambient temperature, changed charging profile, and the like, is reduced.

First of all, one or more aging states within a predefined evaluation period, such as two weeks, one month, two months, or the like, are determined in a vehicle-specific manner with the aid of the basic model. The aging state can be determined as a capacity-dependent aging state SOH-C and/or as a resistance-change-related aging state SOH-R. The aging state is ascertained based on the evaluation of operating variable curves, which are checked with respect to a charging process for ascertaining the SOH-C or with respect to a sufficiently concise current gradient for ascertaining an SOH-R.

One or more load factors, which result, for example, from operating modes of the device battery, such as a curve of the battery temperature, a charging state shift, and the like, which are evaluated for a model-based aging state ascertainment, and/or one or more environmental conditions, such as an average ambient temperature during charging, and the like, are assigned to the ascertained aging state (SOH-C and SOH-R are considered separately). A load factor generally specifies an aggregated variable which depends on at least one environmental state and/or on at least one operating mode and has an influence on the aging state determined at a determined calendar age of the corresponding device battery. The aggregated variable can be specified across the entire operating time of the relevant device battery or for the determination time of the aging state of the relevant device battery.

Subsequently, the determined aging states are fitted in a device-specific manner to a non-parametric or parametric aging state function (linear function or polynomial function) or alternatively smoothed via a sufficiently slow filter in order to ascertain a smoothed curve of the aging state across the calendar age within the evaluation period. From this, it is also possible to determine, with regard to the ascertained aging states, residuals as a particular deviation from the determined parameterized or trained aging state function in the case of a calendar age present in the aging state considered in each case. In addition, aging states from field measurements can also be taken into account with other aging state models.

In particular, the aging state function can correspond to a linear function with a slope of 0 or less than 0 or preferably a curve of the aging states smoothed by means of a low-pass filter or sliding average value over the evaluation period.

The evaluation for determining the correction model takes place over an immediately preceding evaluation period, in which it can be concluded via domain knowledge that no significant aging has taken place within this period of, e.g., 1-2 months, such as an aging state difference of less than a threshold value of, e.g., 0.5%. As a result, the smoothed aging state function can be created by means of simple averaging or on the basis of a simple linear model function. Alternatively, the smoothed function can be effected by means of a sufficiently slow low-pass filter with utilization of seasonal effects. The residual can be determined by ascertaining the difference between the smoothed aging profile and the direct observations of the basic model by subtraction.

The residuals ascertained for the present evaluation period are each associated with the at least one load factor of the corresponding device battery, i.e., the one or more battery states and/or the one or more environmental conditions.

The residuals of all device batteries thus ascertained are now combined and a correction model is created. The correction model can correspond to a parametric model fitted with the residual data or to a data-based probabilistic regression model trained with the residual data, in particular a Gaussian process model or a Bayesian neural network, in order to map the residuals via the at least one load factor, i.e., the one or more of the battery states or the one and/or the plurality of environmental condition(s). The correction model can be parametrically designed in the form of a linear model or polynomial functionals or as a probabilistic regression model, such as a Gaussian process model or a Bayesian neural network, which can additionally provide a confidence of the mapping.

The correction model now maps the one or more of the battery states or the one and/or the plurality of the environmental conditions onto a correction variable. The correction variable serves in particular for the additive application of the particular aging state ascertained from the application of the basic model and can now be applied to determine the corrected aging state.

In particular, when the probabilistic regression model is used as a correction model, a confidence for the ascertained correction variable is determined, wherein the aging state is ascertained depending on the correction variable only if the confidence exceeds a predefined confidence threshold value. If a probabilistic regression model, such as a Gaussian process model or a Bayesian neural network, is thus used for the correction model, the correction can be carried out only if the confidence of the model evaluation is sufficiently high.

The provision of the residual data and the ascertainment of the correction model can be carried out in a central unit remote from the device, wherein in particular model parameters of the correction model are transmitted back to the device and the aging state of the device battery in the battery-operated device is determined or wherein the aging state of the device battery in the central unit is determined.

Furthermore, the aging states are ascertained with the aid of the aging state model and/or the aging state function is ascertained and/or the residuals are ascertained in the device or in the central unit.

The evaluation of the residuals and the correction model can be ascertained in a central unit remote from the device, wherein the correction model or its model parameters is transmitted back to the plurality of devices in order to be able to determine the aging state for the device battery located therein on the basis of the basic model and the detected curves of the operating variables and the correction model.

Furthermore, a predicted aging state trajectory in the form of a smoothed curve can be determined on the basis of the ascertained aging states in order to determine a remaining service life when a predefined aging state threshold is reached.

According to a further aspect, a method is provided, in particular for execution in a central unit remote from the device, for creating a correction model, in particular for use in the method described above, by evaluating operating variables and the particular at least one load factor of a plurality of device batteries, comprising the steps of:

receiving curves of operating variables of the plurality of device batteries and an associated at least one load factor at a particular determination time;

evaluating the operating variables of the plurality of device batteries within an evaluation period in order to ascertain a modeled aging state of the relevant device battery in each case at the particular determination times;

ascertaining an aging state function of a smoothed curve of the aging state within the evaluation period for all aging states of the plurality of device batteries across their calendar age, which aging states result from the particular determination time;

determining residuals of the aging states of all device batteries for each determination time as a difference of the modeled aging state and the function value of the aging state function at the calendar age associated with the modeled aging state;

for the plurality of device batteries, providing residual data which associate residuals with the at least one load factor associated with the accordingly underlying modeled aging state;

creating the correction model based on the residual data, which correction model maps a correction variable dependent on or corresponding to the residuals, depending on the at least one load factor.

The dependence of the at least one load factor on the correction variable can be evaluated and validated by a correlation coefficient or by a hypothesis test of a normal distribution in order to evaluate the quality of the correction model.

According to a further aspect, an apparatus is provided for carrying out the above method.

BRIEF DESCRIPTION OF THE DRAWINGS

Embodiments are explained in more detail below with reference to the accompanying drawings. In the drawings.

DETAILED DESCRIPTION

The method according to the disclosure is described below on the basis of vehicle batteries as device batteries in a motor vehicle as battery-operated device or battery-operated machine. This example is representative of a plurality of stationary or mobile battery-operated machines and devices having a grid-independent power supply, such as vehicles (electric vehicles, pedelecs, etc.), systems, machine tools, domestic appliances, IOT devices, building power supplies, aircraft, in particular drones, autonomous robots and devices of consumer electronics, in particular mobile telephones, and the like, which are connected to a central unit (cloud) via a corresponding communication link (e.g., LAN, Internet).

Figure 1:
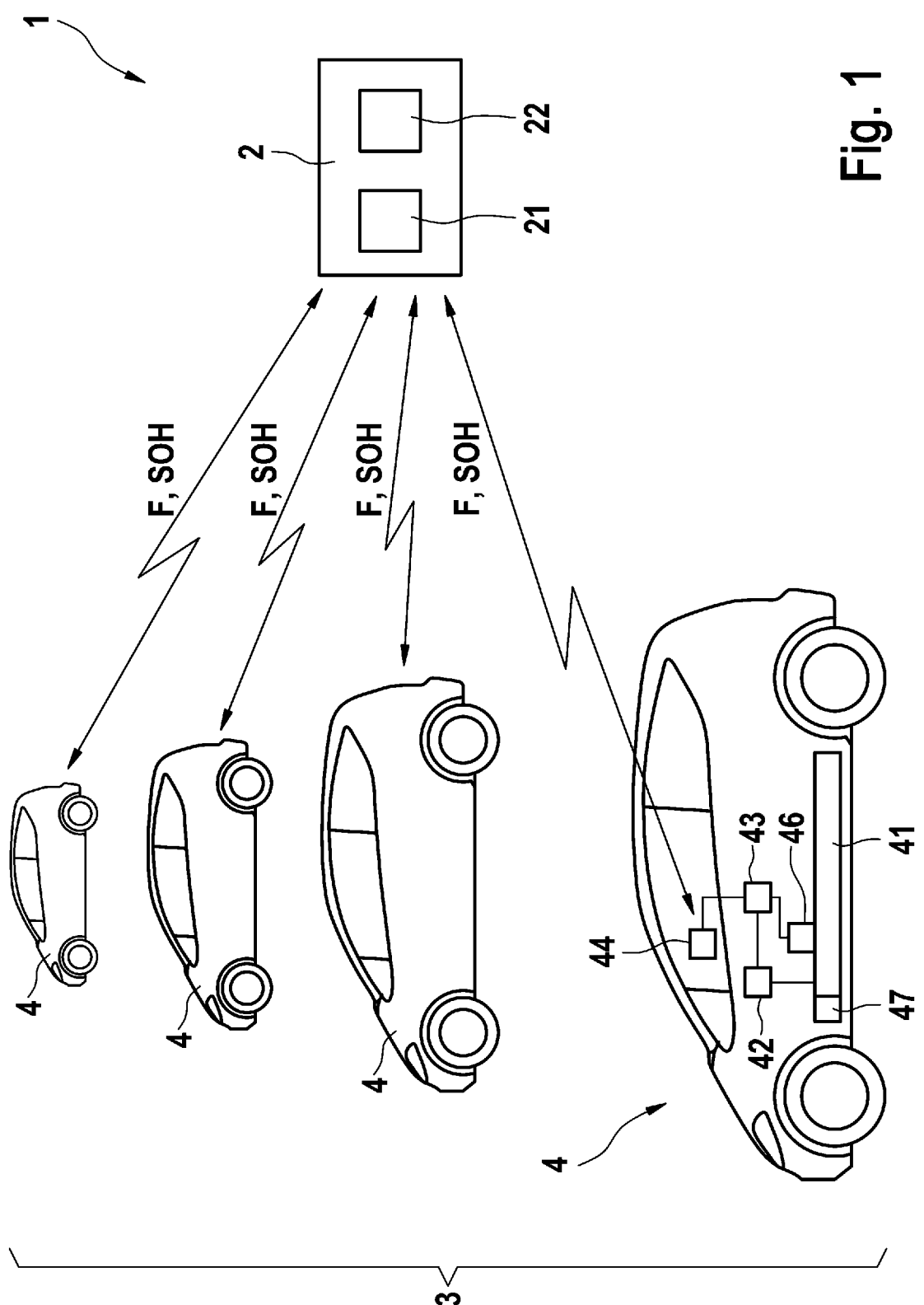
FIG. 1 is a schematic representation of a system for providing, to a central unit, driver- and vehicle-specific operating variables relating to the operation of a vehicle battery of vehicles of a vehicle fleet.

FIG. 1 shows a system 1 for collecting fleet data in a central unit 2 for creating and operating and also for evaluating an aging state model that is designed as a reference or observer model. The reference or observer model is used to determine an aging state value of the vehicle battery in a motor vehicle. The reference or observer model can be run both in the motor vehicle 4 or near the technical (IOT) device or alternatively in the central unit 2.

FIG. 1 shows a vehicle fleet 3 having a plurality of motor vehicles 4. In the central unit 2, a correction model for ascertaining a precise aging state for the vehicle batteries of motor vehicles 4 of the vehicle fleet 3 is intended to be determined on the basis of the fleet data.

One of the motor vehicles 4 is shown in more detail in FIG. 1. The motor vehicles 4 each have a vehicle battery 41 as the device battery, an electric drive motor 42, and a control unit 43. The control unit 43 is connected to a communication module 44, which is suitable for transmitting data between the particular motor vehicle 4 and a central unit 2 (a so-called cloud). The control unit 43 is connected to a sensor unit 45 which has one or more sensors in order to continuously detect operating variables.

The motor vehicles 4 can transmit the operating variables F to the central unit 2, which specify at least variables on which the aging state of the vehicle battery depends or via which the aging state can be determined. In the case of a vehicle battery 41, the operating variables F can specify a present battery current, a present battery voltage, a present battery temperature and a present state of charge (SOC: state of charge), also at the pack, module and/or cell level. The operating variables F are detected depending on the signal type in a fast time pattern of 0.1 Hz to 100 Hz and can be regularly transmitted to the central unit 2 in uncompressed and/or compressed form. For example, the time series can be transmitted in block form to the central unit 2 at an interval of 10 minutes to several hours.

Alternatively, in accordance with methods described below, aging states can also be ascertained, depending on the operating variable curves in the control units, at determination times in conjunction with one or more battery states and/or one or more environmental conditions. These data can then be transmitted to the central unit instead of or in addition to the operating variable curves. Residuals and the aging function can also be determined according to methods described below from the operating variable curves and can alternatively or additionally be transmitted to the central unit 2.

The central unit 2 has a data processing unit 21, in which the method described below can be executed, and a database 22 for storing aging states of the vehicle batteries 41 of a plurality of vehicles 4 of the vehicle fleet 3 together with the respective associated determination times.

The aging state (SOH: state of health) is the key variable for specifying a remaining battery capacity or remaining battery charge. The aging state represents a measure of the aging of the vehicle battery or of a battery module or of a battery cell and can be specified as the remaining capacity (SOH-C) or as a rise in the internal resistance (SOH-R). The remaining capacity (SOH-C) is specified as the ratio of the measured present capacity to a starting capacity of the fully charged battery. The relative change in the internal resistance SOH-R increases with increasing aging of the battery.

A correction model is intended to be determined in the central unit 2, which correction model is, in particular, wholly or partially based on data. The correction model is ascertained on the basis of evaluations of an aging state model which is executed in a vehicle-specific manner and on the basis of residuals with respect to an aging function derived from the ascertained aging states, and the correction model can thus be provided in each case to the individual vehicles so that, depending on one or more environmental conditions and/or one or more battery states, a correction variable for the ascertained aging state inside the device can be provided.

Figure 2:
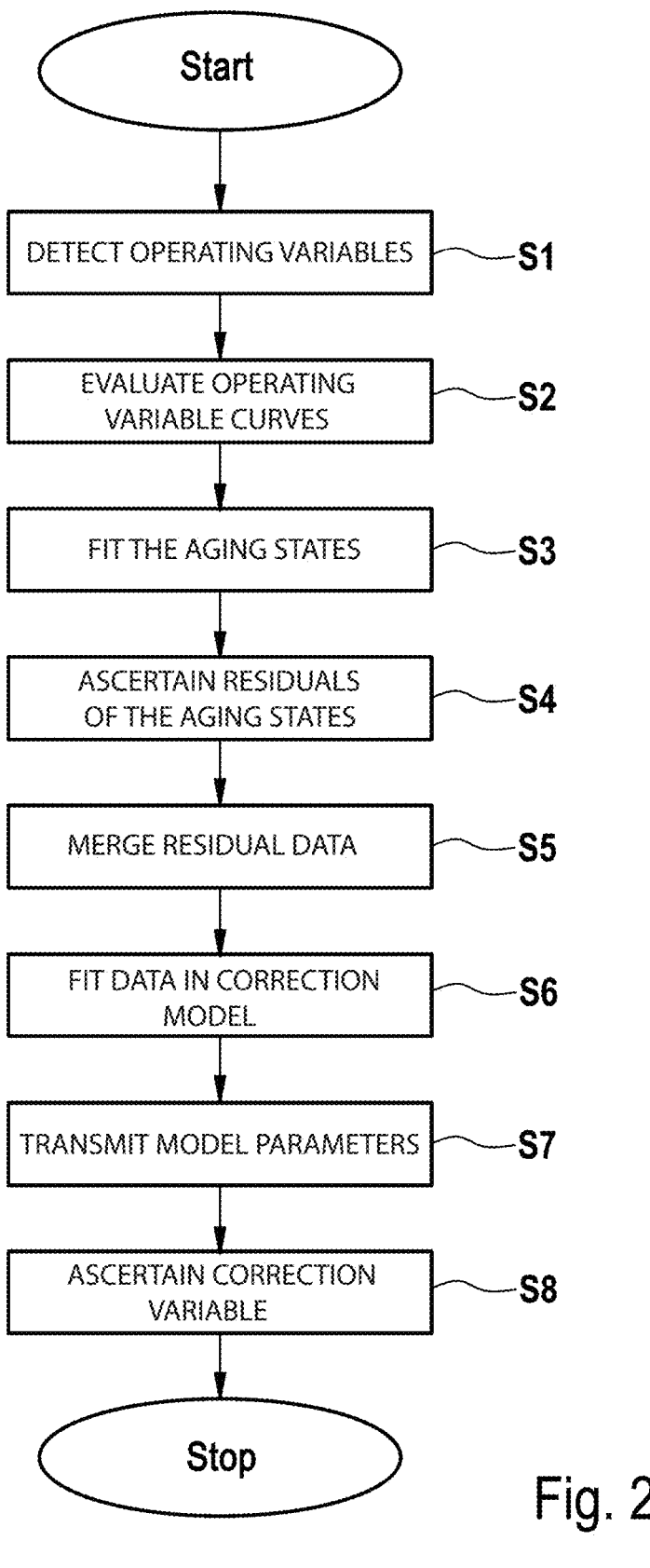
FIG. 2 is a flow chart for illustrating a method for ascertaining an aging state for a vehicle battery in a motor vehicle having an unknown battery type.

FIG. 2 is a flow chart for illustrating a method for providing an aging state in a motor vehicle. As described above, the method uses operating variable curves of a plurality of motor vehicles having identical vehicle batteries 41 and a central unit 2 and provides a common correction model.

In step S1, operating variables F, which can comprise a battery current, a battery voltage, a battery temperature and a state of charge, are continuously detected by the vehicles 4 of the vehicle fleet 3.

In step S2, the obtained operating variable curves are now evaluated within an evaluation period of, for example, two weeks, one month, two months, or the like, in order to obtain an aging state in each case at determination times within the evaluation period.

The operating variables F can now be analyzed according to the basic model in order to detect events which are suitable according to the basic model for ascertaining an aging state. The basic model can be model-based and comprise, e.g., observations on the basis of electrochemical models, e.g., on the basis of equilibrium and kinetic parameters which are ascertained from rest phases or dynamic load phases. Alternatively or additionally, the basic model can comprise direct or indirect measurements of the aging state. In both variants, current counting can be used as an instrument which can be assigned to environmental conditions or load conditions.

According to the basic model described above, a capacity-related aging state SOH-C and/or a resistance-related aging state SOH-R can be ascertained in a manner known per se, for example based on coulomb counting or an evaluation of an internal resistance gradient. The ascertainment can be carried out internally in the vehicle or in the central unit 2 after transmission of the operating variables to the central unit 2. Alternatively, another aging state model can also be used to ascertain the aging state. Furthermore, a plurality of aging state models can also be used, wherein the aging states ascertained in this way can be fused with respect to a determination time. Aging states can also be obtained with the aid of an aging state observer or by an aging state measurement.

With the detection of the operating variable curves, one or more battery states and/or one or more environmental conditions are ascertained as an aggregated variable and assigned to the corresponding aging state as one or more load factors at a determination time for which a present aging state is ascertained. The one or more load factors generally specify a load to which the particular vehicle battery was exposed over its service life (time since commissioning) or at the time of ascertaining the particular aging state.

Subsequently, in S3, the aging states are fitted according to the calendar age specified by the determination times (time between commissioning of the brand-new vehicle battery and the determination time) to an aging state function which maps the aging state across the calendar age of the evaluation period. Creating the aging state function takes into account domain knowledge that no significant aging occurs within the evaluation period. The aging state function can therefore provide smoothing by means of a sufficiently slow low-pass filter, designed, e.g., as a PT1 or PT2 element or alternatively having a sliding average.

In this case, the low-pass filter is parameterized such that the time constant or the time constants on the basis of battery domains are plausible, and:

the aging state SOHC of the vehicle battery 41 is a monotonically decreasing function aging in the evaluation period (e.g., 1-2 months) is sufficiently small, e.g., <1% SOHC.

As an alternative to the low-pass filter, a constant or linear curve of the aging state during a sufficiently short evaluation period, e.g., 1-2 months, can also be assumed. As an alternative to this, a sliding average can be used as a filter, so that noise of the basic model observations is sufficiently suppressed and a smoothed aging curve emerges.

In step S4, residuals of the aging states with respect to the aging state function determined in a vehicle-specific manner are ascertained for each vehicle 4 or vehicle battery 41, so that a deviation between the aging state ascertained on basis of the model and the aging state ascertained by the aging state function is specified with respect to each determination time. Due to the assignment of the aging state ascertained by means of the basic model or in a different way, the residuals are also assigned to the one or more battery states determined/detected for this purpose and/or to the one or more environmental conditions. These residual data can be detected and ascertained in the individual vehicle 4 or can be determined remotely from the vehicle after prior transmission to the central unit 2.

One or more of the following variables can be considered as load factors, i.e., as systematic state and environmental influences:

ambient temperature for the time of determination of the relevant aging state;

battery temperature for at least one time or an average battery temperature during the determination of the relevant aging state;

the starting state of charge and/or a final state of charge when determining the aging state during a charging process;

a specification of a non-linearity of the current curve or state-of-charge curve during the determination of the relevant aging state or a partial specification of the relationship of a state of charge shift to an ampere-hour throughput (dSoC/dAh) during a charging process;

one or more no-load terminal voltages, specifically in the relaxed state after a sufficiently long rest phase at one or more predetermined temperatures;

a battery temperature at a predetermined no-load terminal voltage in the relaxed state after a sufficiently long rest phase;

the aging state of the battery;

one or more electrochemical state parameters of the battery cells of the battery.

In particular, a global nonlinear current curve dSoC/dAh=f(SoC) can be ascertained. Here, the SOC can correspond to an SOC state of the BMS.

One or more load factors can represent inputs of the correction function.

The dependency of the aging state measurement or the evaluation using the aging state model or the aging state observer on the systematic state influences and environmental influences can be evaluated by a correlation coefficient or by a hypothesis test of a normal distribution.

Figure 3:
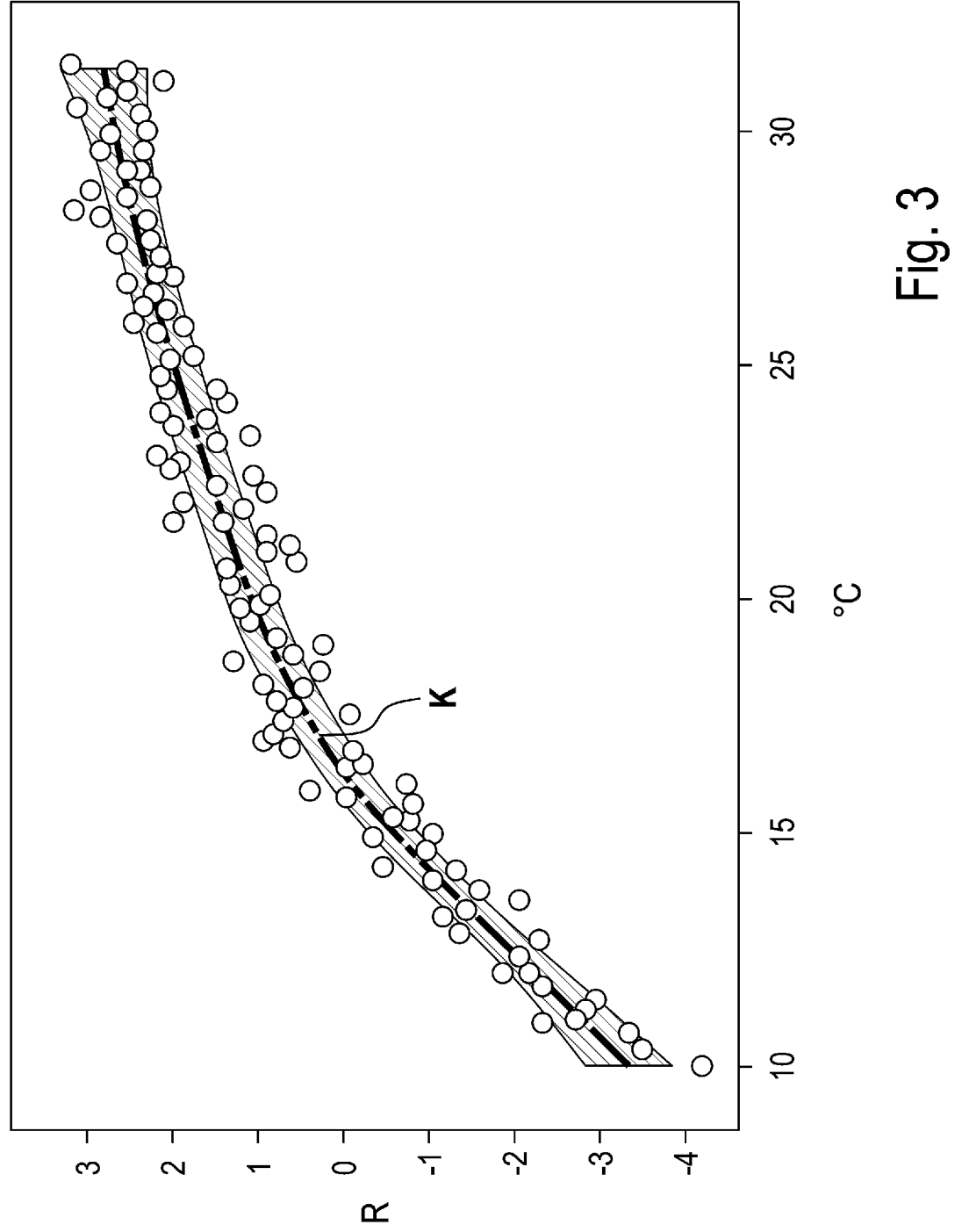
FIG. 3 is a representation of a correction model based on the residuals of aging states from the vehicles of the vehicle fleet.

In step S5, the residual data of all vehicle batteries 41 are now merged in the central unit 2 and, in particular, fitted in a correction model in step S6. The correction model can be designed as a parametric model, for example a linear function or a polynomial functional, or also as a probabilistic regression model, such as a Gaussian process model or a Bayesian neural network. In the former case, the correction model is fitted to the available residual data, and in the latter case the probabilistic regression model is trained according to the available residual data. For this purpose, the load factors or the systematic state influences and environmental influences serve as features in a multidimensional regression problem. If necessary, the training state of the probabilistic regression model can be validated with a part of the residual data thus detected, by, e.g., being subdivided into training, test and validation data. The correction model maps the one or more load factors onto a correction variable, which can preferably be interpreted as an aging state difference dependent on the one or more load factors. This is then additively applied to the aging state ascertained in a battery-specific manner In FIG. 3, by way of example, such a correction model with the residual data and an average battery temperature is applied as a battery state. The points represent the residuals R of all vehicle batteries 41 by means of which the correction model is fitted or trained. In principle, the correction model can comprise dependencies of a plurality of the one or more battery states and the one or more environmental conditions. In this way, a correction model can be provided for correcting the ascertainment of an aging state for all vehicles 4 of the vehicle fleet 41. The correction can take place by applying the output of the correction model by addition to the observation of the aging state made by the basic model.

In step S7, the model parameters of this correction model can now be transmitted from the central unit 2 to the vehicles, so that, in the case of the vehicle-internal calculation of an aging state in the vehicle, in step S8 a correction variable can be ascertained depending on the corresponding battery states and/or environmental conditions.

The effectiveness of the correction of the aging state ascertained in the vehicle using the correction model can be evaluated by a correlation coefficient or by a hypothesis test of a normal distribution.

In this case, the aim is to create the correction model in such a way that, after correction, there is no longer a systematic dependence of the corrected aging state on the one or more load factors taken into account, that is to say, e.g., a correlation coefficient according to Pearson is ~0 and/or the residual is normally distributed and structure-free. An evaluation in this regard takes place here across all vehicle batteries and consequently utilizes the swarm intelligence of the entire fleet.

The aging state ascertained in the vehicle can be applied to the correction variable in order to ascertain a corrected aging state. If a probabilistic regression model is used, a confidence for the ascertained correction variable can also be output. Advantageously, the confidence is calibrated or validated, such that, for example, the 90% confidence interval comprises, e.g., representatively 90% of all observations across multiple batteries made by the basic model; see FIG. 3. A correction of the aging state ascertained in the vehicle can now take place depending on the confidence of the correction variable. For example, if the confidence is smaller than a predefined confidence threshold value, the correction of the aging state ascertained in the vehicle is not carried out using the correction model.

Furthermore, a prediction of the aging state in the vehicle 4 can be performed from the corrected aging states in order to be able to specify therein a remaining service life, for example.

What is claimed is:

1. A method for ascertaining an aging state of a device battery of a battery-operated device, comprising:
detecting curves of operating variables of the battery-operated device;
providing at least one load factor at a determination time of detecting the curves of the operating variables;
providing a correction model that maps a correction variable based on the at least one load factor;
ascertaining the aging state of the device battery by evaluating the curves of the operating variables based on (i) an aging state model, an aging state observer, or an aging state measurement, and (ii) the correction variable;
creating the correction model by:
receiving curves of operating variables of corresponding device batteries of a plurality of device batteries and at least one associated load factor at a particular determination time for each of the corresponding device batteries;
evaluating the received curves of operating variables of the corresponding device batteries within an evaluation period to ascertain, for each of the device batteries of the plurality of device batteries, a modeled aging state, of a plurality of modeled aging states, of the corresponding device battery at the particular determination time;
ascertaining, for each of the device batteries of the plurality of device batteries, a corresponding smoothed aging state function curve calculated from all aging states of the plurality of device batteries within the evaluation period across a corresponding calendar age of the device batteries of the plurality of device batteries;
determining residuals of the aging states of all of the device batteries for each particular determination time as a difference of the modeled aging state and a function value of the corresponding smoothed aging state function at the corresponding calendar age associated with the modeled aging state;
for the plurality of device batteries, providing residual data which associates residuals with the at least one load factor associated with a correspondingly underlying modeled aging state of the plurality of modeled aging states; and
creating the correction model based on the residual data, the correction model configured to map the correction variable dependent on or corresponding to the residuals, based on the at least one load factor; and
operating the battery-operated device using electrical energy from the device battery according to the ascertained aging state of the device battery.

2. The method according to claim 1, wherein:
the at least one load factor comprises one or more battery states and/or one or more environmental conditions to which the device battery is exposed during the ascertainment of the aging state, and
the at least one load factor comprises one or more of:
an ambient temperature for the time of determination of the corresponding aging state;
a battery temperature for at least one time or an average battery temperature during the determination of the corresponding aging state;
a starting state of charge and/or a final state of charge when determining the aging state during a charging process;
a specification of a non-linearity of a current curve or state of charge curve during the determination of the corresponding aging state or a partial specification of a relationship of a state-of-charge shift to an ampere-hour throughput (dSoC/dAh) during a charging process;
one or more no-load terminal voltages in a relaxed state after a sufficiently long rest phase at one or more predetermined temperatures;
a battery temperature at a predetermined no-load terminal voltage in the relaxed state after a sufficiently long rest phase;
the aging state of the device battery; and
one or more electrochemical state parameters of battery cells of the device battery.

3. The method according to claim 1, wherein the operating variables comprise at least one of battery current, battery voltage, battery temperature, and state of charge.

4. The method according to claim 1, wherein:
the aging state is provided as a capacity-related aging state or as a resistance-change-related aging state; and
the aging state model is configured to ascertain the capacity-related aging state by evaluating a battery current during a charging phase of the device batteries, using a coulomb counting method, or to ascertain the resistance-change-related aging state by evaluating a voltage gradient of a load jump which is greater than a predefined threshold value.

5. The method according to claim 1, wherein the corresponding smoothed aging state function corresponds to a linear function with a slope of 0 or less than 0, or corresponds to a curve of the aging states across the evaluation period, which curve is smoothed using a low-pass filter, provided as a PT1 or PT2 filter, or corresponds to smoothing by a sliding average value.

6. The method according to claim 1, wherein the correction model corresponds to a parametric model fitted with the residual data or to a data-based probabilistic regression model trained with the residual data, provided as a Gaussian process model or a Bayesian neural network.

7. The method according to claim 6, wherein:

when the probabilistic regression model is used as a correction model, a confidence for the ascertained correction variable is determined; and the aging state is ascertained depending on the correction variable only when the confidence exceeds a predefined confidence threshold value.

8. The method according to claim 1, wherein:

providing the residual data and creating the correction model is carried out in a central unit remote from the device;

model parameters of the correction model are transmitted back to the device; and the aging state of the device battery is determined in the battery-operated device or in the central unit.

9. The method according to claim 8, wherein a predicted aging state trajectory configured as a smoothed curve is determined based on the ascertained aging states to determine a remaining service life when a predefined aging state threshold is reached.

10. The method according to claim 1, wherein the correction model is created in a central unit remote from the device.

11. The method according to claim 10, wherein the dependence of the at least one load factor on the correction variable is evaluated and validated by a correlation coefficient or by a hypothesis test of a normal distribution in order to evaluate a quality of the correction model.

12. An apparatus configured to carry out the method of claim 1.

13. A non-transitory machine-readable storage medium, comprising commands which, when executed by at least one data processing device, cause the data processing device to execute steps of the method according to claim 1.

* * * * *